US008289091B2

(12) United States Patent
Yang et al.

(10) Patent No.: US 8,289,091 B2
(45) Date of Patent: Oct. 16, 2012

(54) RELAXATION OSCILLATOR

(75) Inventors: Jeong Mo Yang, Seoul (KR); Changsik Yoo, Seoul (KR); Young Jin Moon, Gwangju (KR); Yong Seong Roh, Incheon (KR); Joong Ho Choi, Gyunggi-do (KR); Jae Shin Lee, Gyunggi-do (KR); Jung Chul Gong, Seoul (KR); Yu Jin Jang, Gyunggi-do (KR)

(73) Assignees: Samsung Electro-Mechanics Co., Ltd., Gyunggi-do (KR); University of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 13/005,054

(22) Filed: Jan. 12, 2011

(65) Prior Publication Data

US 2012/0086515 A1     Apr. 12, 2012

(30) Foreign Application Priority Data

Oct. 12, 2010    (KR) .................. 10-2010-0099405

(51) Int. Cl.
*H03K 3/26* (2006.01)
(52) U.S. Cl. ........................... 331/111; 331/143
(58) Field of Classification Search .................. 331/111, 331/143; 327/131, 182
See application file for complete search history.

(56) References Cited

U.S. PATENT DOCUMENTS

| 5,508,664 | A | * | 4/1996 | Rizzo ............................ 331/111 |
| 7,109,804 | B2 | * | 9/2006 | Mader et al. ...................... 331/16 |
| 2002/0041217 | A1 | * | 4/2002 | Crofts et al. .................... 331/175 |
| 2007/0103244 | A1 | * | 5/2007 | D'Abramo et al. ........... 331/111 |
| 2010/0066457 | A1 | * | 3/2010 | Muller ........................... 331/111 |

FOREIGN PATENT DOCUMENTS

KR     1020090043220 A     5/2009

* cited by examiner

*Primary Examiner* — Joseph Chang
*Assistant Examiner* — Jeffrey Shin
(74) *Attorney, Agent, or Firm* — Lowe, Hauptman, Ham & Berner, LLP

(57) ABSTRACT

A relaxation oscillator includes a ramp wave generator configured to generate a ramp wave by complementary first capacitor module charged and discharged according to a first switching signal and second capacitor module charged and discharged according to a second switching signal, a negative feedback circuit unit configured to generate a compensation voltage for compensating an error between the ramp wave and a reference voltage through a feedback of the ramp wave, and a switching signal generator configured to generate the first switching signal and the second switching signal from the compensation voltage and the ramp wave, including a peak voltage storage unit configured to store a peak voltage of the ramp wave that is controlled to be equal to the reference voltage based on the compensation voltage and a peak voltage transfer unit configured to transfer the peak voltage of the ramp wave to the negative feedback unit.

10 Claims, 5 Drawing Sheets

FIG. 3C

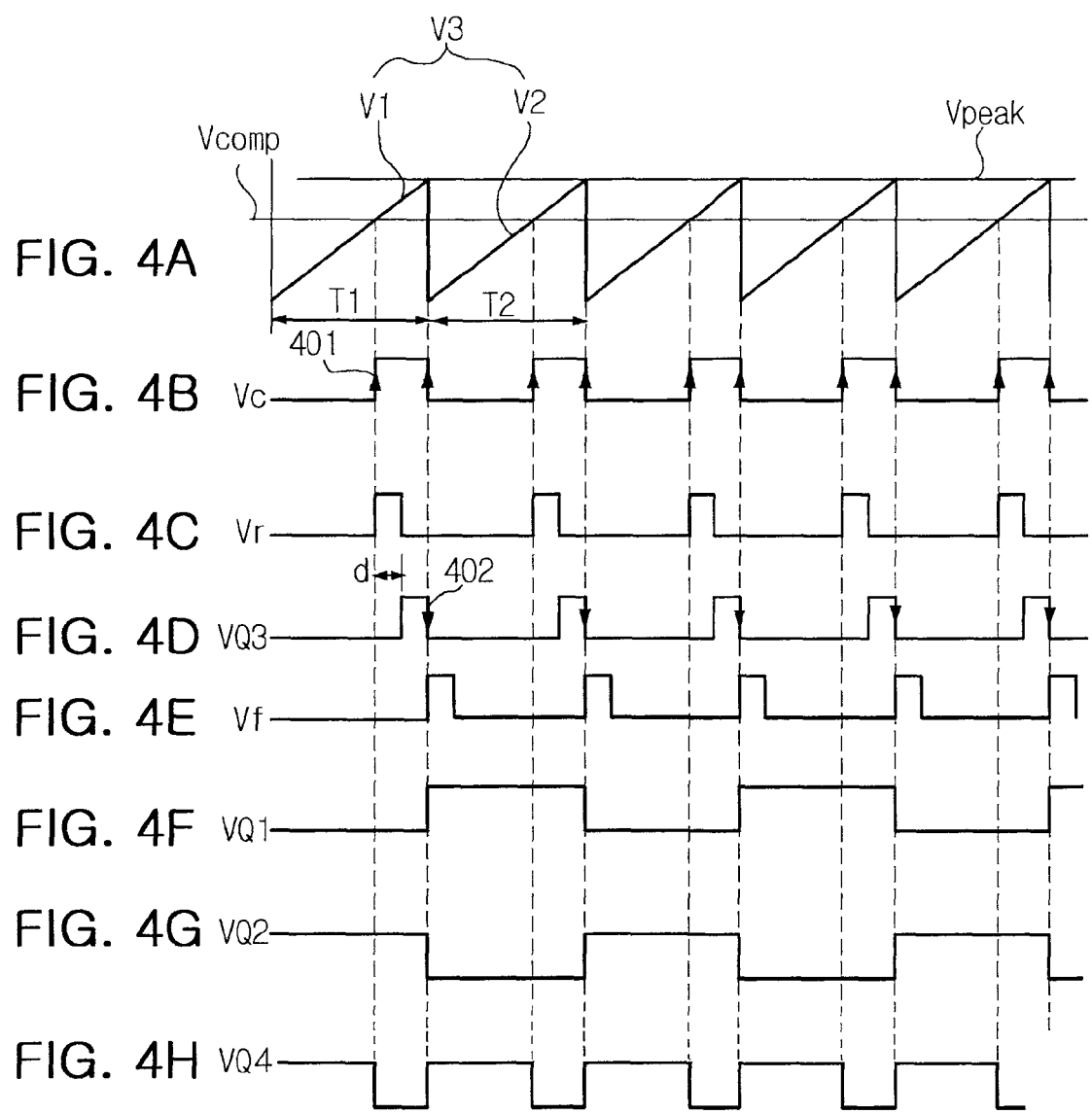

RELAXATION OSCILLATOR

CROSS-REFERENCE TO RELATED APPLICATIONS

This application claims the priority of Korean Patent Application No. 10-2010-0099405 filed on Oct. 12, 2010, in the Korean Intellectual Property Office, the disclosure of which is incorporated herein by reference.

BACKGROUND OF THE INVENTION

1. Field of the Invention

The present invention relates to a relaxation oscillator, and more particularly, to a relaxation oscillator capable of generating a ramp wave having a stable frequency while preventing a frequency from being changed due to a delay or an offset of a comparator by controlling a peak voltage of the ramp wave to be equal to a reference voltage by using a negative feedback loop.

2. Description of the Related Art

Recently, a power supply unit or a light emitting diode (LED) driver requires a high-efficiency DC-DC converter due to increased interest in the energy efficiency of electronics. In order to stably operate the DC-DC converter, it is necessary to use an oscillator having a stable frequency. Generally, the oscillator is a circuit generating output signals without input signals, which can generate various waveforms, such as a sine wave, a square wave, a triangular wave, a sawtooth wave, or the like.

In particular, the relaxation oscillator charges and discharges a capacitor at such time as a unique threshold voltage of circuits therein is reached, so as to generate oscillation signals. The relaxation oscillator includes a comparator for making a comparison with the threshold voltage. However, the comparator originally has an offset or a delay, such that the relaxation oscillator cannot provide a stable frequency.

SUMMARY OF THE INVENTION

An aspect of the present invention provides a relaxation oscillator capable of generating ramp waves having a stable frequency.

According to an aspect of the present invention, there is provided a relaxation oscillator, including: a ramp wave generator generating ramp waves by a complementary operation between a first capacitor module charged and discharged according to a first switching signal and a second capacitor module charged and discharged according to a second switching signal; a negative feedback circuit unit generating a compensation voltage for compensating errors with reference voltage by being fed back with the ramp waves; and a switching signal generator generating the first switching signal controlling the charging and discharging of the first capacitor module and the second switching signal controlling the charging and discharging of the second capacitor module from the compensation voltage and the ramp waves.

The first capacitor module may include: a first current source; a first capacitor charged by current input from the first current source to generate ramp waves having a predetermined slope; and a first switch connected to the first capacitor in parallel and discharging the voltage charged in the first capacitor by the first switching signal, and the second capacitor module may include: a second current source; a second capacitor charged by current input from the second current source to generate ramp waves having a predetermined slope; and a second switch connected to the second capacitor in parallel and discharging the voltage charged in the second capacitor by the second switching signal.

The switching signal generator may include: a peak voltage storage unit storing a peak voltage of the ramp wave that is controlled to be equal to the reference voltage, based on the compensation voltage; and a peak voltage transfer unit transferring the peak voltage to the negative feedback unit.

The peak voltage storing unit may include: a comparator outputting a comparison signal comparing the compensation voltage with the ramp wave; a rising edge detector detecting the rising edge of the comparison signal to output a first pulse having a predetermined width; a delay unit outputting a delay pulse delaying the first pulse by a predetermined time, and a third capacitor storing the peak voltage of the ramp wave to be equal to the reference voltage, based on the delay pulse.

The peak voltage transfer unit may include: a falling edge detector detecting the falling edge of the delay pulse to output a second pulse having a predetermined width; an SR latch unit outputting a transfer signal of the stored peak voltage when the second pulse is input; and a T-flip flop outputting the complementary first switching signal and second switching signal according to the transfer signal.

The negative feedback circuit unit may include an integration circuit integrating the difference between the compensation voltage and the reference voltage.

The rising edge detector may include: a first inverter unit receiving the comparison signal and including an odd number of inverters connected to each other in series; and an AND gate receiving an output signal from the first inverter unit and the comparison signal.

The falling edge detector may include: a second inverter unit receiving the delayed pulse and including an even number of inverters connected to each other in series; a third inverter unit connected to the second inverter unit in parallel, and receiving the delayed pulse and including an odd number of inverters connected to each other in series; and an AND gate receiving the output from the second inverter unit and the third inverter unit.

The width of the first pulse may be based on the number of inverters included in the first inverter unit and the width of the second pulse is based on the number of inverters included in the second inverter unit and the third inverter unit.

BRIEF DESCRIPTION OF THE DRAWINGS

The above and other aspects, features and other advantages of the present invention will be more clearly understood from the following detailed description taken in conjunction with the accompanying drawings, in which:

FIGS. 3A to 3E are diagrams showing a configuration and a waveform of a falling edge detector of FIG. 1;

FIGS. 4A To 4H are diagrams showing waveforms of each component of FIG. 1; and

DETAILED DESCRIPTION OF THE PREFERRED EMBODIMENT

Figure 1:
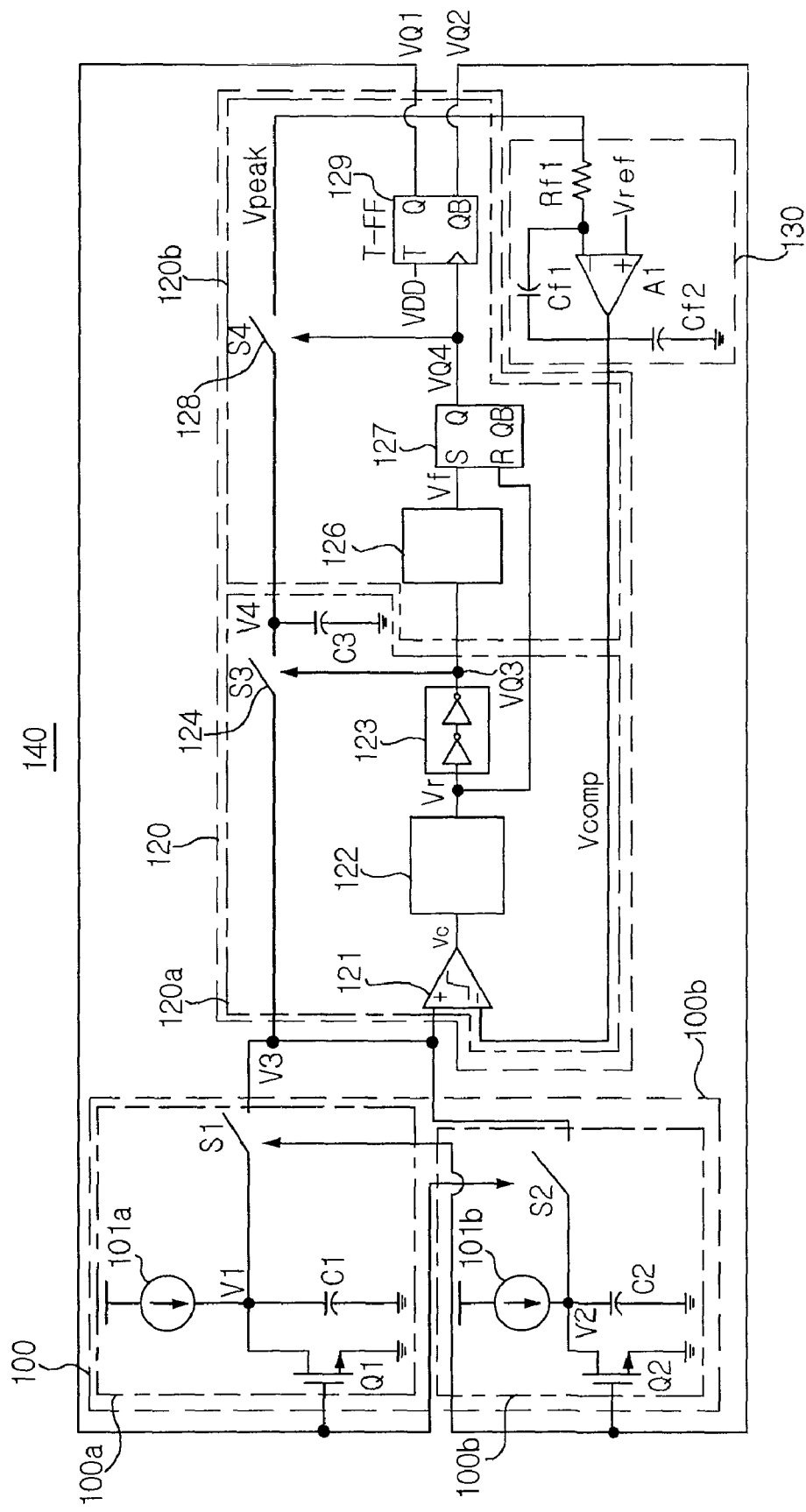
FIG. 1 is a configuration diagram showing a relaxation oscillator according to an exemplary embodiment of the present invention.

FIG. 1 is a configuration diagram showing a relaxation oscillator according to an exemplary embodiment of the present invention. A relaxation oscillator 140 may be configured to include a ramp wave generator 100 generating ramp waves by a complementary operation between a first capacitor module 100a charged and discharged according to a first switching signal VQ1 and a second capacitor module 100b charged and discharged according to a second switching signal VQ2, a negative feedback circuit unit 130 generating a compensation voltage for compensating errors with reference voltage by being fed back with the ramp waves, and a switching signal generator 120 generating the first switching signal VQ1 controlling the charging and discharging of the first capacitor module 100a and the second switching signal VQ2 controlling the charging and discharging of the second capacitor module 100b from the compensation voltage and the ramp waves.

Hereinafter, the relaxation oscillator 140 will be described in detail with reference to FIG. 1.

Referring to FIG. 1, the ramp wave generator 100 may be configured to include the first capacitor module 100a and the second capacitor module 100b.

The first capacitor module 100a may be configured to include a first current source 101a that is a constant current source, a first capacitor C1 generating ramp waves having a predetermined slope by being charged with current input from the first current source 101a, a first transistor Q1 connected to the first capacitor C1 in parallel and discharging the voltage charged in the first capacitor C1 by the first switching signal VQ1, and a switch S1 for connecting a voltage V1 charged in the first capacitor C1 to the switching signal generator 120.

Meanwhile, the second capacitor module 100b may be configured to include a second current source 101b that is a constant current source, a second capacitor C2 generating ramp waves having a predetermined slope by being charged with current input from the second current source 101b, a second transistor Q2 connected to the second capacitor C2 in parallel and discharging the voltage charged in the second capacitor C2 by the second switching signal VQ2, and a switch S2 for connecting voltage V2 charged in the second capacitor C2 to the switching signal generator 120.

Meanwhile, the switching signal generator 120 may be configured to include a peak voltage storage unit 120a storing a peak voltage Vpeak of a ramp wave V3 to be equal to a reference voltage Vref, based on a compensation voltage Vcomp and a peak voltage transfer unit 120b transferring the peak voltage Vpeak to the negative feedback circuit unit 130.

In detail, the peak voltage storage unit 120a may be configured to include a comparator 121 outputting a comparison signal Vc comparing the compensation voltage Vcomp with the ramp wave V3, a rising edge detector 122 detecting the rising edge of the comparison signal Vc to output a first pulse Vr having a predetermined width, a delay unit 123 outputting a pulse VQ3 delaying the first pulse by a predetermined time, and a third capacitor C3 storing the peak voltage Vpeak of the ramp wave to be equal to the reference voltage Vref, based on the delay pulse VQ3. The delay unit 123 may be configured of the even number of inverter elements connected in series.

Meanwhile, the peak voltage transfer unit 120b may be configured to include a falling edge detector 126 detecting the falling edge of the delay pulse VQ3 output from the delay unit 123 to output a second pulse Vf having a predetermined width, an SR latch unit 127 outputting a transfer signal VQ4 of the peak voltage Vpeak stored in the third capacitor C3 when the second pulse Vf is input, and a T-flip flop 129 outputting the complementary first switching signal VQ1 and second switching signal VQ2 according to the transfer signal VQ4.

The negative feedback circuit unit 130 generates the compensation voltage Vcomp to control the peak voltage Vpeak fed back through a resistance Rfl from the peak voltage transfer unit 120b to be equal to the reference voltage Vref and transfers it to the comparator 121 of the peak voltage storage unit 120a. As shown in FIG. 1, the negative feedback circuit unit 130 may be configured to include an OP amplifier A1 and an integration circuit including a resistance RF1 and capacitors Cf1 and Cf2.

FIGS. 2A to 2D are diagrams showing a configuration and a waveform of a rising edge detector of FIG. 1.

Figure 2A:
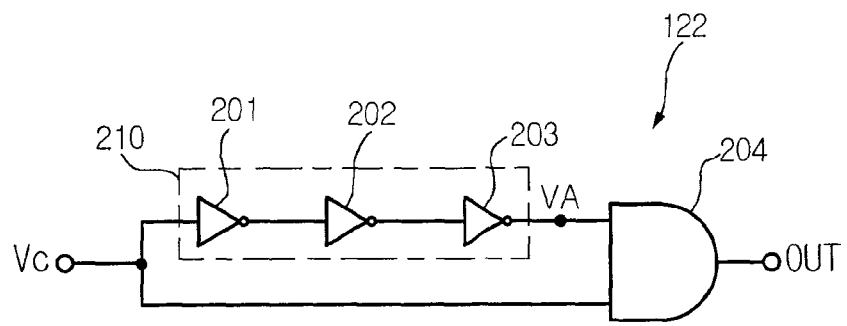
FIGS. 2A to 2D are diagrams showing a configuration and a waveform of a rising edge detector of FIG. 1.

As shown in FIG. 2A, the rising edge detector 122 may be configured to include a first inverter unit 210 including inverters 201 to 203 connected to each other in series to delay the input signal Vc by a predetermined time and a single AND gate 204 receiving the input signal Vc and a signal VA from the first inverter unit 210. Preferably, the number of inverters 201 to 203 is the odd number and the width d1 of pulse may be determined according to the number of inverters. The signal Vr output from the rising edge detector 122 substantially becomes a signal rising from a rising timing corresponding to a rising edge 401 of the input signal Vc.

Figure 2B:
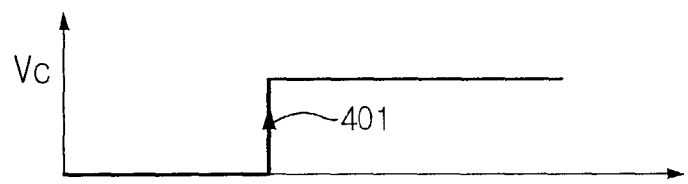
Figure 2C:
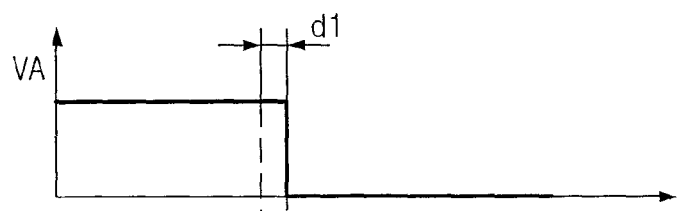
Figure 2D:
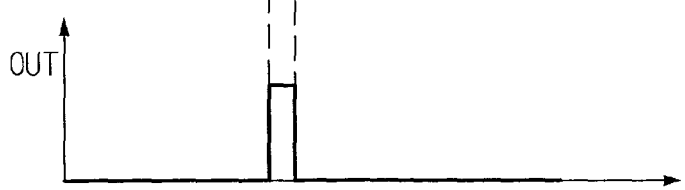

In other words, as shown in FIG. 2B, when the input signal Vc is input, the signal VA to an input terminal of the AND gate 204 has a predetermined delay d1 by the odd number of inverters 201 to 203 as shown in FIG. 2C. Meanwhile, the signal VA and the input signal Vc are input to the AND gate 204. As a result, the signal output from the AND gate 204 becomes the pulse signal having the width d1 delayed by the first inverter unit 210 as shown in FIG. 2D.

Meanwhile, FIGS. 3A to 3E are diagrams showing a configuration and a waveform of a falling edge detector of FIG. 1.

Figure 3A:
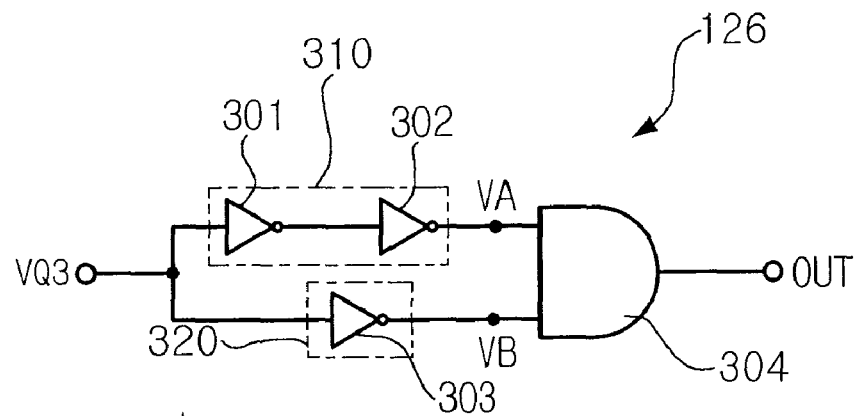

As shown in FIG. 3A, the falling edge detector 126 may be configured to include a second inverter unit 310 including inverters 301 to 302 connected to each other in series to delay the input signal VQ3 by a predetermined time, a third inverter unit 320 including an inverter 303 delaying the input signal VQ3 by a predetermined time and inverting and outputting it, and a single AND gate 304 receiving the output signal from the second inverter unit 310 and the output signal from the third inverter unit 320. Preferably, the number of inverters included in the second inverter unit 310 is configured as an even number and the number of inverters included in the third inverter unit 320 is configured as an odd number, wherein the number of inverters included in the second inverter unit 310 is larger than the number of inverters included in the third inverter unit 320. Meanwhile, the widths d2 and d3 of pulse output from the falling edge detector 126 may be determined according to the number of inverters. In addition, since the delay time d3 has a very small value, the signal output from the falling edge detector 126 substantially becomes a signal rising at a falling timing corresponding to a falling edge 402 of the input signal VQ3.

Figure 3B:
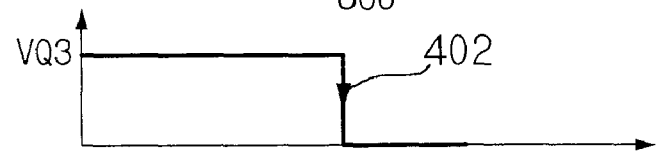
Figure 3D:
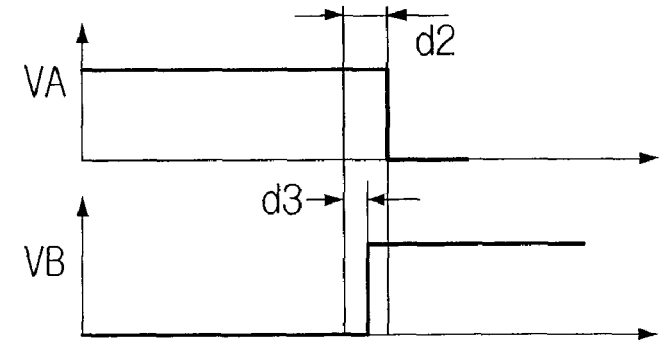
Figure 3E:
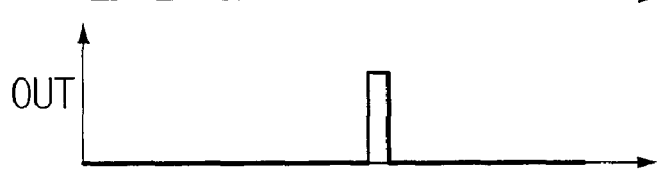

In other words, as shown in FIG. 3B, when the input signal VQ3 is input, the signal VA to the input terminal of the AND gate 304 has a predetermined delay d2 by the even number of inverters 301 to 302 in the second inverter unit 310 as shown in FIG. 3C. Meanwhile, when the input signal VQ3 is input, the signal VB to the input terminal of the AND gate 304 becomes the inverting signal having the predetermined delay d3 by the odd number of inverters 303 in the third inverter unit 320 as shown in FIG. 3D. Thereafter, the output from the second inverter unit 310 and the output from the third inverter unit 320 are input to the AND gate 304. As a result, the signal output from the AND gate 304 becomes a pulse signal having a short width as shown in FIG. 3E.

Figure 5:
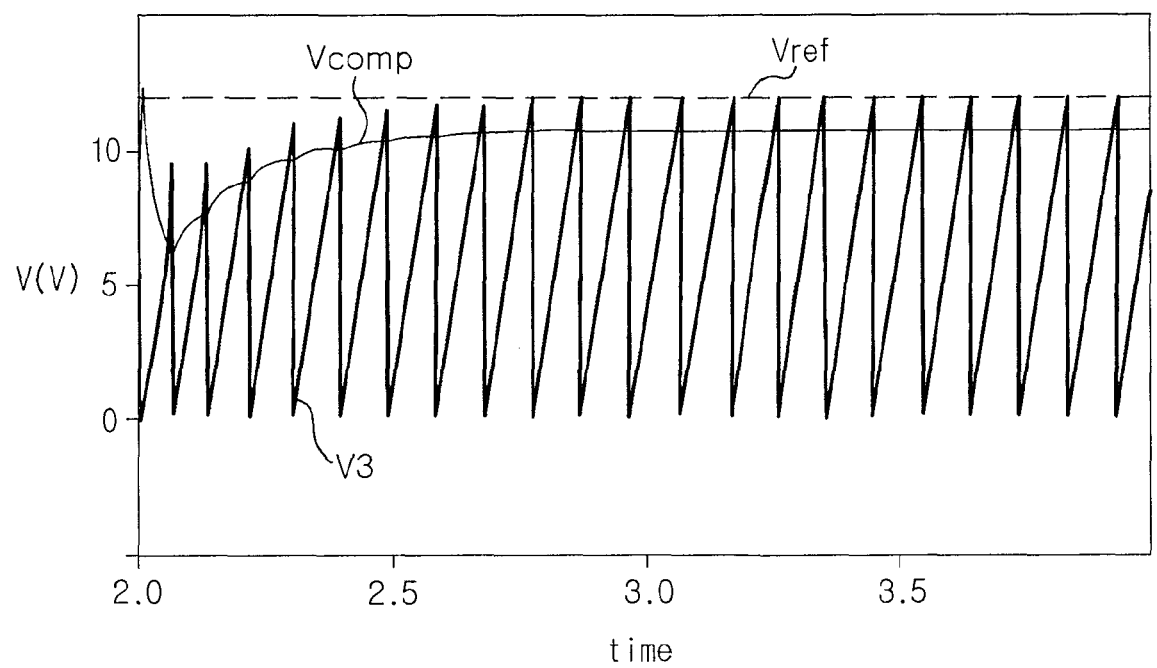
FIG. 5 is a diagram showing a convergence process of a compensation voltage.

FIGS. 4A to 4H are diagrams showing waveforms of each component of FIG. 1 and FIG. 5 is a diagram showing a convergence process of the compensation voltage.

Hereinafter, the process of generating the ramp waves from the relaxation oscillator according to the exemplary embodiment of the present invention will be described in detail with reference to FIGS. 1 to 5. In FIG. 4A, period 1 shows one period of the ramp wave generated by the first capacitor module 100a and period T2 shows one period of the ramp wave generated by the second capacitor module 100b. The operation of each component during period T2 is the same as the operation during period T1, and therefore, the waveforms of each component will be mainly described during period T1.

Referring to FIGS. 1 to 5, the compensation voltage Vcomp transferred from the negative feedback circuit unit 130 is input to a (−) terminal of the comparator 121 and the ramp wave V3 output from the ramp wave generator 100 is input to a (+) terminal of the comparator 121 and the comparator 121 outputs the comparison signal Vc as shown in FIG. 4B. The comparison signal Vc output from the comparator 121 is transferred to the rising edge detector 122.

The rising edge detector 122 is configured as shown in FIG. 2A and detects the rising edge 401 of the comparison signal Vc transferred from the comparator 121 and the first pulse Vr having a predetermined width is generated as shown in FIG. 4C. The generated first pulse Vr is transferred to the delay unit 123.

As shown in FIG. 4D, the delay unit 123 generates the delay pulse VQ3 delaying the first pulse Vr transferred from the rising edge detector 122 by a predetermined time. The generated delay pulse VQ3 is transferred to the falling edge detector 126. Meanwhile, the switch S3 is closed by the generated delay pulse VQ3. In this case, the voltage of the ramp wave V3 is stored in the capacitor C3.

The falling edge detector 126 is configured as shown in FIG. 3A and detects the falling edge 402 of the delay pulse VQ3 transferred from the delay unit 123 and generates the pulse having a predetermined width rising at the falling timing corresponding to the falling edge 402 of the delay pulse VQ3, as shown in FIG. 4E. The generated pulse is input to an S terminal of the SR latch unit 127.

As shown in FIG. 4H, the SR latch unit 127 outputs a signal VQ4 to a Q terminal when the pulse Vf is input from the falling edge detector 126. The output signal VQ4 is transferred to the T-flip flop 129 and the switch S4. When the switch S4 is turned-on according to the signal VQ4, the voltage of the ramp wave stored in the capacitor C3 is input to the (−) terminal of the negative feedback circuit unit 130. Thereafter, the negative feedback circuit unit 130 generates the compensation voltage Vcomp compensating errors between the voltage of the ramp wave input to the (−) terminal and the reference voltage Vref input to the (+) terminal and the generated compensation voltage Vcomp is transferred to the comparator 121 of the switching signal generator 120. The waveforms of the compensation voltage Vcomp, the ramp wave V3, and the reference voltage Vref transitioned from an initial state to a normal state are shown in FIG. 5. Finally, the peak voltage of the ramp wave V3 is the same as the reference voltage Vref.

Meanwhile, the T-flip flop 129 outputs a voltage VDD though a Q terminal when the pulse VQ4 from the SR latch unit 127 is input (see FIG. 4H), the signal output through the Q terminal becomes the first switching signal VQ1. The first switching signal VQ1 is input to the gate of the transistor Q1 of the first capacitor module 100a to turn-on the first transistor Q1. As the first transistor Q1 is turned-on, the voltage V1 charged in the capacitor C1 is discharged through the transistor Q1. Further, the first switching signal VQ1 is transferred to the switch S2 to turn-on the switch S2, such that the second capacitor module 100b may be connected to the switching signal generator 120.

Meanwhile, the second switching signal VQ2 is output through a QB terminal. The second switching signal is a complementary signal with the first switching signal VQ1. When the first switching signal VQ1 is a VDD, the second switching signal VQ2 becomes 0. The transistor Q2 is turned-off by the second switching signal VQ2 that is 0. Therefore, the capacitor C2 is charged by the second current source 101b while having a predetermined slope as shown in FIG. 4A.

As set forth above, the present invention can generate the ramp wave having the stable frequency while preventing the frequency from being changed due to the delay or the offset of the comparator by controlling the peak voltage of the ramp wave to be equal to the reference voltage by using the negative feedback loop.

While the present invention has been shown and described in connection with the exemplary embodiments, it will be apparent to those skilled in the art that modifications and variations can be made without departing from the spirit and scope of the invention as defined by the appended claims.

What is claimed is:

1. A relaxation oscillator, comprising:
a ramp wave generator configured to generate a ramp wave by a complementary operation between a first capacitor module charged and discharged according to a first switching signal and a second capacitor module charged and discharged according to a second switching signal;
a negative feedback circuit unit configured to generate a compensation voltage for compensating an error between the ramp wave and a reference voltage through a feedback of the ramp wave; and
a switching signal generator configured to generate the first switching signal and the second switching signal from the compensation voltage and the ramp wave, wherein the switching signal generator includes:
a peak voltage storage unit configured to receive the ramp wave from the ramp wave generator and the compensation voltage from the negative feedback circuit and to store a peak voltage of the ramp wave that is controlled to be equal to the reference voltage based on the compensation voltage; and
a peak voltage transfer unit configured to transfer the peak voltage of the ramp wave stored in the peak voltage storage unit to the negative feedback unit.

2. The relaxation oscillator of claim 1, wherein the first capacitor module includes:
a first current source;
a first capacitor charged by a current input from the first current source to generate a first ramp wave having a predetermined slope; and
a first switch connected to the first capacitor in parallel and for discharging a voltage charged in the first capacitor by the first switching signal, and
the second capacitor module includes:
a second current source;
a second capacitor charged by a current input from the second current source to generate a second ramp wave having a predetermined slope; and
a second switch connected to the second capacitor in parallel and for discharging a voltage charged in the second capacitor by the second switching signal.

3. The relaxation oscillator of claim 1, wherein the peak voltage storing unit includes:

a comparator configured to compare the compensation voltage with the ramp wave and to output a result of comparison as a comparison signal;

a rising edge detector configured to detect a rising edge of the comparison signal to output a first pulse having a predetermined width;

a delay unit configured delay the first pulse by a predetermined time and to output a delayed pulse; and a third capacitor configured to store the peak voltage of the ramp wave based on the delayed pulse.

4. The relaxation oscillator of claim 3, wherein the peak voltage transfer unit includes:

a falling edge detector configured to detect a falling edge of the delayed pulse to output a second pulse having a predetermined width;

an SR latch unit configured to receive the second pulse and to output a transfer signal of the stored peak voltage; and a T-flip flop configured to output the complementary first switching signal and second switching signal according to the transfer signal.

5. The relaxation oscillator of claim 1, wherein the negative feedback circuit unit includes an integration circuit configured to integrate a difference between the compensation voltage and the reference voltage.

6. The relaxation oscillator of claim 3, wherein the rising edge detector includes:

a first inverter unit configured to receive the comparison signal and having including an odd number of inverters connected in series; and an AND gate configured to receive an output signal from the first inverter unit and the comparison signal.

7. The relaxation oscillator of claim 6, wherein the width of the first pulse is determined based on the number of inverters included in the first inverter unit.

8. The relaxation oscillator of claim 4, wherein the falling edge detector includes:

a second inverter unit configured to receive the delayed pulse and including an even number of inverters connected in series;

a third inverter unit connected to the second inverter unit in parallel, and configured to receive the delayed pulse and including an odd number of inverters connected in series; and an AND gate configured to receive outputs from the second inverter unit and the third inverter unit.

9. The relaxation oscillator of claim 8, wherein the width of the second pulse is determined based on the number of inverters included in the second inverter unit and the third inverter unit.

10. The relaxation oscillator of claim 8, wherein the number of inverters included in the second inverter unit is larger than the number of inverters included in the third inverter unit.

* * * * *